(12) United States Patent
Dejima et al.

(10) Patent No.: US 11,048,096 B2
(45) Date of Patent: Jun. 29, 2021

(54) LIGHT SOURCE DEVICE

(71) Applicant: NICHIA CORPORATION, Anan (JP)

(72) Inventors: Norihiro Dejima, Yokohama (JP); Takahiro Oyu, Chiyoda-ku (JP)

(73) Assignee: NICHIA CORPORATION, Anan (JP)

( * ) Notice: Subject to any disclaimer, the term of this patent is extended or adjusted under 35 U.S.C. 154(b) by 192 days.

(21) Appl. No.: 16/203,448

(22) Filed: Nov. 28, 2018

(65) Prior Publication Data

US 2019/0162973 A1 May 30, 2019

(30) Foreign Application Priority Data

Nov. 29, 2017 (JP) .............................. JP2017-228954

(51) Int. Cl.
| | | |
|---|---|---|
| *G02B 27/09* | (2006.01) | |
| *G02B 5/18* | (2006.01) | |
| *G02B 27/10* | (2006.01) | |
| *H01S 5/14* | (2006.01) | |

(Continued)

(52) U.S. Cl.
CPC .......... *G02B 27/0955* (2013.01); *G02B 5/18* (2013.01); *G02B 27/0905* (2013.01); *G02B 27/0922* (2013.01); *G02B 27/0944* (2013.01); *G02B 27/0966* (2013.01); *G02B 27/1086* (2013.01); *H01S 5/141* (2013.01); *G02B 5/10* (2013.01); *G02B 27/30* (2013.01)

(58) Field of Classification Search
CPC ............ G02B 27/0955; G02B 27/1086; G02B 27/0944; G02B 5/18; G02B 27/0966; G02B 27/0905; G02B 27/0922; G02B 27/30; G02B 5/10; H01S 5/141; H01S 3/08059; H01S 5/4062
See application file for complete search history.

(56) References Cited

U.S. PATENT DOCUMENTS

| | | | |
|---|---|---|---|
| 2012/0236884 A1 | 9/2012 | Fujimoto et al. | |
| 2014/0169391 A1* | 6/2014 | Kono | H01S 5/141 372/18 |
| 2014/0240831 A1 | 8/2014 | Chann | |

(Continued)

FOREIGN PATENT DOCUMENTS

| | | |
|---|---|---|
| JP | H08-064896 | 3/1996 |
| JP | 2000-332322 | 11/2000 |

(Continued)

*Primary Examiner* — Kimberly N. Kakalec
(74) *Attorney, Agent, or Firm* — Foley & Lardner LLP

(57) ABSTRACT

A light source device includes: a light source part comprising a plurality of laser light sources, each laser light source being configured to emit light having a predetermined wavelength width; a plurality of collimators; a light-condensing part configured to adjust light emitted from the collimators into parallel light and to condense the parallel light; a diffraction grating configured to receive the condensed light; and an output coupler disposed in an optical path of diffracted light from the diffraction grating so as to form an external resonator with the laser light sources, wherein a reflecting surface of the output coupler is a depressed surface; and an adjusting lens disposed downstream of the output coupler, the adjusting lens being configured to convert light emitted from the output coupler into substantially parallel light or to condense the light emitted from the output coupler.

7 Claims, 7 Drawing Sheets

(51) Int. Cl.
    *G02B 27/30*       (2006.01)
    *G02B 5/10*        (2006.01)

(56) References Cited

U.S. PATENT DOCUMENTS

2017/0187162 A1    6/2017  Hamilton et al.
2017/0207605 A1*   7/2017  Morita ................. H01S 5/4012

FOREIGN PATENT DOCUMENTS

| JP | 2006-339358 | 12/2006 | | |
| JP | 2011-204942 | 10/2011 | | |
| JP | 2011-204943 | 10/2011 | | |
| JP | 2011-222944 | 11/2011 | | |
| JP | 2014-120560 | 6/2014 | | |
| JP | 2015-106707 | 6/2015 | | |
| JP | 2017-511607 | 4/2017 | | |
| WO | WO-2016013653 A1 * | 1/2016 | ........... | H01S 5/4012 |

* cited by examiner

LIGHT SOURCE DEVICE

CROSS-REFERENCE TO RELATED PATENT APPLICATION

The present application claims priority under 35 U. S. C. § 119 to Japanese Patent Application No. 2017-228954, filed on Nov. 29, 2017, the contents of which are incorporated herein by reference in their entirety.

BACKGROUND

The present disclosure relates to a light source device that applies wavelength beam combining to produce a high-power laser light.

There has been increasing demand for light source devices that emit a high-power laser beam in various fields including laser processing, such as laser welding. Examples of light source devices that emit a high-energy laser beam include light source devices that apply wavelength beam combining (hereinafter may also be referred to as "WBC devices"). One example thereof is a WBC system described in Japanese Patent Publication No. 2015-106707 (JP2015-106707A). As described in JP2015-106707A, a WBC device mainly includes a light source part (e.g., a laser diode bar) having an array of a plurality of laser light sources (e.g., laser diodes), each configured to emit light of a predetermined wavelength, a collimator (e.g., collimation lens) configured to collimate laser beams emitted from the laser light sources, a condensing part (e.g., a condensing lens) configured to condense laser beams emitted from the collimator, a diffraction grating configured to receive condensed laser beams from the condensing part, and an output coupler (e.g., a partially reflecting mirror) disposed in an optical path of diffracted laser beams from the diffraction grating.

SUMMARY OF THE INVENTION

In a WBC device, an external resonator is formed with an array of laser light sources and an output coupler such that a portion of diffracted beams are reflected back at the output coupler so as to be reciprocated between the laser light sources and the output coupler and amplified. The reflecting surface of the output coupler is generally flat such that only a portion of the diffracted beams that are perpendicularly incident on the flat surface are reflected back to respective optical paths and resonate (hereinafter may be referred to as "externally resonate" and combined into a single beam).

However, due to various causes, a part of laser light sources of the light source part may deviate from their designed positions. Such deviation may be a deformation, a typical example thereof is a deformation referred to as "smile," an example of which is shown on row 3 in FIG. 2 of JP2015-106707A. Such a deformation may cause deviation in heights of the laser light sources of the light source unit. When passing through corresponding collimators, the laser beams emitted from such laser light sources having heights that deviate from the optical axis of corresponding collimators propagate at an angle with respect to the optical axis of the collimators. When such beams are diffracted by a diffraction grating, the diffracted beams are also obliquely incident on the optical coupler and thus are not reflected back to respective optical paths, and therefore the beams cannot externally resonate and are not combined into a single beam, resulting in a decrease in the output power of the laser beam of the WBC device. The laser beams that cannot externally resonate are mostly outputted in the state of internal resonance, thus lowering the quality of the laser beams.

Accordingly, an object of certain embodiments of the present disclosure is to provide a light source device that allows the laser beams emitted from laser light sources to externally resonate even if the positions of the light sources are offset from respective designed positions.

A light source device according to one embodiment of the present invention includes a light source part having an array of a plurality of laser light sources, each configured to emit light of a predetermined wavelength width; a plurality of collimators each configured to collimate the light emitted from a corresponding one of the laser light sources into substantially parallel light; a light-condensing part configured to adjust the substantially parallel light emitted from each of the collimators into parallel light and to condense the parallel light; a diffraction grating configured to receive and diffract the light condensed by the light-condensing part; and an output coupler disposed in an optical path of the diffracted light diffracted by the diffraction grating and to form an external resonator with the laser light sources. The output coupler has a light-reflecting surface that is a depressed surface. The light source device further includes an adjusting lens configured to convert the light emitted from the output coupler into substantially parallel light, or to condense the light emitted from the output coupler.

The present disclosure can provide a light source device in which, even when some positional misalignment has occurred when disposing the laser light sources, the light emitted from the light sources is allowed to externally resonate.

BRIEF DESCRIPTION OF THE DRAWINGS

A more complete appreciation of the disclosure and many of the attendant advantages thereof may be readily obtained by reference to the following detailed description when considered in connection with the accompanying drawings.

Figure 1:
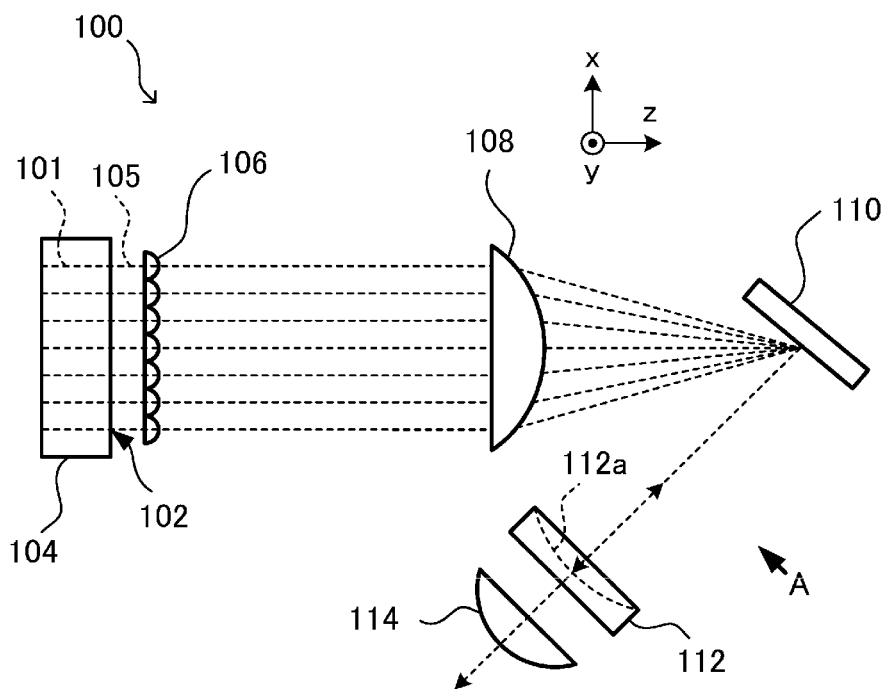
FIG. 1 is a schematic diagram of a light source device according to one embodiment of the present invention.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of the present specification is not intended to be limited to the specific terminology so employed and it is to be understood that each specific element includes all technical equivalents that have a similar function, operate in a similar manner, and achieve a similar result.

As used herein, the singular forms "a", "an", and "the" are intended to include the plural forms as well, unless the context clearly indicates otherwise.

Embodiments of the present disclosure are described below with reference to the drawings, in which like reference numerals designate identical or corresponding parts throughout the drawings.

A light source device according to one embodiment of the present invention includes a light source part having an array of a plurality of laser light sources, each configured to emit light of a predetermined wavelength width; a plurality of collimators each configured to collimate the light emitted from corresponding one of the laser light sources into substantially parallel light; a light-condensing part configured to change the substantially parallel light emitted from each of the collimators into parallel light and to condense the parallel light; a diffraction grating configured to receive and diffract the light condensed by the light-condensing part; and an output coupler disposed in an optical path of the diffracted light diffracted by the diffraction grating and to form an external resonator with the laser light sources. The output coupler has a light-reflecting surface that is a depressed surface. The light source device further includes an adjusting lens configured to change the light emitted from the output coupler into substantially parallel light, or to condense the light emitted from the output coupler.

FIG. 1 is a schematic diagram of a light source device 100 according to one embodiment. The light source device 100 includes a laser diode bar 104, a plurality of collimators 106, a light-condensing part 108, a diffraction grating 110, an output coupler 112, and an adjusting lens 114. In the drawings, optical paths are schematically shown by broken lines such as in FIG. 1, where individual laser beams 105 emitted from the light-emitting parts 102 are shown by broken lines. Although a laser beam has a divergence angle and a beam width, each laser beam is shown by its optical axis in the figures for ease of explanation.

The laser diode bar 104 includes a plurality of laser diodes (seven in the example shown in FIG. 1) having light-emitting end-portions that are arranged laterally in a row formed on the same substrate. The laser diode is an example of a laser light source. In FIG. 1, each of the laser diodes is indicated by a respective one of waveguides 101. The laser diode bar 104 has light-emitting portions 102 aligned laterally on one surface, each of which is located at an end of a respective one of the waveguides 101 and is configured to emit a beam of a predetermined wavelength width. In this respect, each light-emitting portion 102 can also be regarded as a laser light source. In other words, the laser diode bar 104 includes a plurality of light-emitting portions 102 (that is, a plurality of laser light sources) arranged laterally in a row. The laser diode bar 104 is an example of a light source part.

An example of light of a predetermined wavelength width emitted from a light-emitting portion 102 is a light beam with a center wavelength of 405 nm and a gain (i.e., wavelength width) Δλ of 10 nm. In this case, the wavelength range of the light emitted from the light-emitting portion 102 is 400 nm to 410 nm.

Each collimator 106 is configured to collimate the light emitted from the corresponding one of the light-emitting portions 102 into substantially parallel light. Each collimator 106 may be, for example, a collimation lens arranged opposing a corresponding one of the light-emitting portions 102. Each of the collimators 106 may be a single lens or a lens group comprising a plurality of lenses. The collimators 106 may be collimation lenses, each corresponding to a respective one of the light-emitting portions 102, and may be arranged laterally in a row to form a lens array.

The light-condensing part 108 is configured to collimate the individual light emitted from the collimators 106 into parallel light and then condense the parallel light. The light-condensing part 108 may be formed with a single condensing lens, a lens group comprising a plurality of lenses, or a mirror. When a laser diode bar is employed for the light source part as in the present embodiment, the light-condensing part 108 may include a spherical lens or a cylindrical lens.

Light condensed by the light-condensing part 108 is incident on the diffraction grating 110 at different incident angles, which is then diffracted by the diffraction grating 110 in the direction of the same diffraction angle and combined.

The output coupler 112 is disposed in the optical path of the diffracted light such that the optical axis of the output coupler 112 is aligned with the optical axis of the diffracted light diffracted by the diffraction grating 110. The output coupler 112 may be a partially reflecting mirror that reflects a portion of the diffracted light. The laser diodes of the laser diode bar 104 and the output coupler 112 form an external resonator, between which light is allowed to propagate backwards and forwards and is amplified. The light-reflecting surface 112a of the output coupler 112 may be a depressed surface.

The adjusting lens 114 is configured to collimate the light emitted from the output coupler 112 into substantially parallel light or to condense the light emitted from the output coupler 112.

As shown in FIG. 1, for ease of explanation, the direction of an optical axis of the light-condensing part 108 is indicated as a z-axis, the arrangement direction in which the light-emitting portions 102 are laterally aligned is indicated as an x-axis, and a direction perpendicular to the z-axis and the x-axis is indicated as a y-axis. FIG. 1 is a schematic diagram of the light source device 100 projected in the y-axis direction. In the specification, the y-axis direction may also be indicated as a height direction or an up/down direction.

Figure 2:
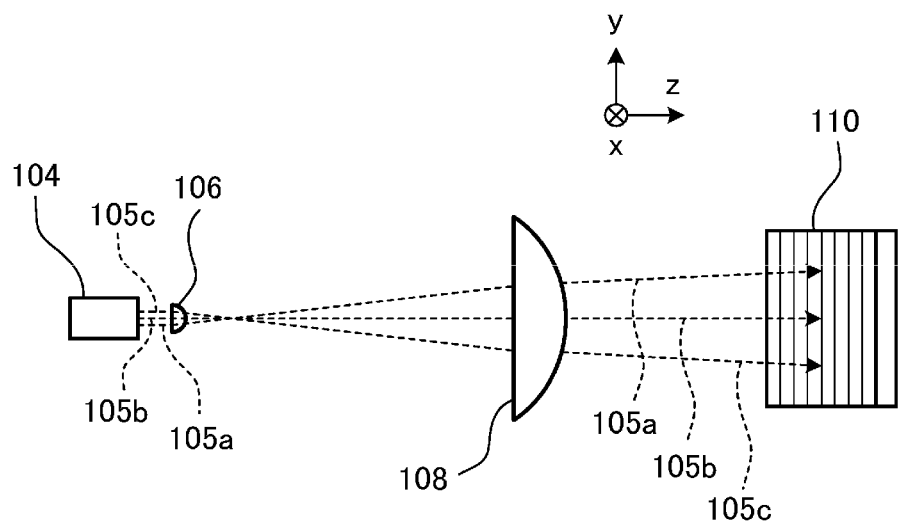
FIG. 2 is a schematic diagram showing a part of the light source device of FIG. 1 observed along the x-axis.

FIG. 2 is a schematic diagram showing a part of the light source device of FIG. 1 observed along the x-axis. Thus, FIG. 2 is a schematic diagram of the light source device 100 projected in the x-axis direction. For the sake of easy understanding, the output coupler 112 and the adjusting lens 114 are not shown in FIG. 2. As shown in FIG. 2, the diffraction grating 110 has a one-dimensional grating pattern arrayed in parallel to the y-axis direction. The collimators 106, each corresponding to a respective one of the light-emitting portions 102, are arranged such that the optical axes of the collimators 106 are parallel to the optical axis of the light-condensing part 108 and at the same height as the optical axis of the light-condensing part 108.

FIG. 2 is a schematic diagram illustrating a case in which the laser diode bar 104 is deformed, causing a deviation in the height distribution (position in the y-axis direction) of the light-emitting portions 102. In FIG. 2, light emitted from different light-emitting portions 102 is shown by three broken lines and which are hereinafter referred to as a first beam 105*a*, a second beam 105*b*, and a third beam 105*c*. The center, the second beam 105*b* indicates a light beam emitted from a second light-emitting portion 102 located at the same height with the optical axis of its corresponding second collimator 106 and the optical axis of the light-condensing part 108. The lower, first beam 105*a* indicates a light beam emitted from a first light-emitting portion 102 located at the lowest position among the light-emitting portions 102. The higher, third beam 105*c* indicates a light beam emitted from a third light-emitting portion 102 located at the highest position among the light-emitting portions 102.

The second beam 105*b* is emitted at the same height as the optical axis of the collimator 106 (i.e., corresponding collimator 106*b*) and the optical axis of the light-condensing part 108, so that the second beam 105*b* is not refracted upward or downward upon passing the collimator 106*b* and the light-condensing part 108 and propagates in parallel to the x-z plane. If the optical axis of the second beam 105*b* precisely coincides with the optical axis of the corresponding collimator 106*b* and the optical axis of the light-condensing part 108, that is, as a beam at the center of the seven parallel beams 105 shown by broken lines in FIG. 1, when the optical axis of the second beam 105*b* precisely coincides with the optical axis of the corresponding collimator 106*b* and the optical axis of the light-condensing part 108 also in the xz plane, the second beam 105*b* is not refracted upon passing the collimator 106*b* and the light-condensing part 108 and propagates linearly along the optical axis of the light-condensing part 108.

The first beam 105*a* propagates offset from the optical axis of the collimator 106 (i.e., corresponding collimator 106*a*) and enters the collimator 106*a* from below the optical axis of the collimator 106*a*, and is refracted in an upward direction when the first beam 106*a* passes through the collimator 106*a*. Meanwhile, the third beam 105*c* propagates offset from the optical axis of the collimator 106 (i.e., corresponding collimator 106*c*) and enters the collimator 106*c* from below the optical axis of the collimator 106*c*, and is refracted in a downward direction when the third beam 105*c* passes through the collimator 106*c*. Although it is ideal for the propagating direction of such light that has passed through the collimator 106 and upwardly or downwardly refracted at an angle with respect to the optical axis of the collimator 106 is made in parallel to the x-z plane by the light-condensing part 108, a beam that is perfectly in parallel to the x-z plane is difficult to obtain due to various causes.

For example, in the case in which the optical axis of light emitted from the light-emitting portion 102 has a small upward or downward inclination angle with respect to the x-z plane and also the position of the light-emitting portion 102 deviates in a height direction with respect to the optical axis of the collimator 106, the light emitted from the light-emitting portion 102 is refracted upward or downward by the collimator 106 to propagate at an angle but does not pass the rear focal point of the collimator 106. For ease of explanation, the light-emitting portion 102 located at the center of seven light-emitting portions 102 in FIG. 1 will be illustrated as representative. That is, the optical axis of light emitted from the light-emitting portion 102 is assumed aligned with no deviation from the optical axis of the collimator 106 and the optical axis of the light-condensing part 108 in the x-axis direction. Generally, the front focal point of the light-condensing part 108 is adapted in conformity with the rear focal point of the collimator 106, such that light that does not pass through the rear focal point of the collimator 106 will not pass through the front focal point of the light-condensing part 108. Accordingly, even when such light passes through the light-condensing part 108, the beam will not propagate in a direction in parallel to the x-z plane.

The laser beam emitted from the light-emitting portion 102 also has a predetermined divergent angle. Accordingly, when the position of the light-emitting portion 102 is misaligned with the optical axis of the collimator 106 in the height direction, the laser beam emitted from the light-emitting portion 102 and cannot be perfectly focused by the collimator 106 to the rear focal point. As described above, light that does not pass through the rear focal point of the collimator 106 will not propagate in a direction parallel to the x-z plane even after passing through the light-condensing part 108. Some portion of such light may gradually diverge away from the optical axis of the light-condensing part 108, as the first beam 105*a* and the third beam 105*c* shown in FIG. 2. The first beam 105*a*, the second beam 105*b*, and the third beam 105*c* passed through the light-condensing part 108 are incident on the diffraction grating 110.

Figure 3:
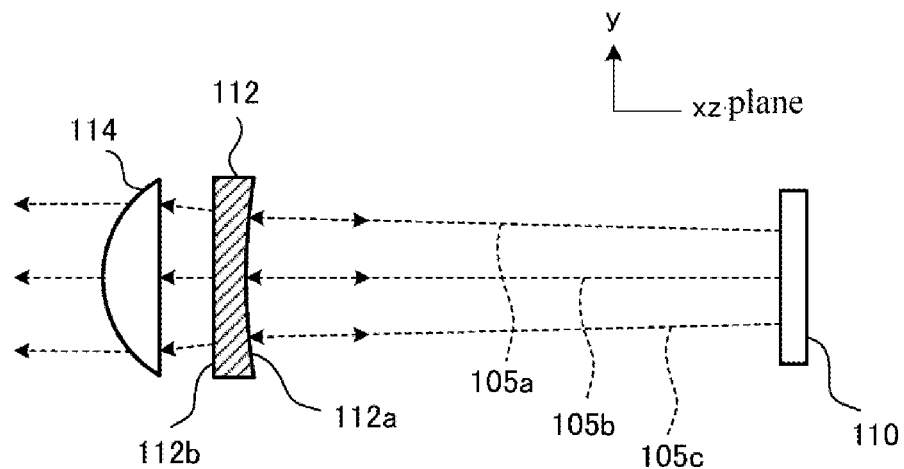
FIG. 3 is a schematic diagram showing a part of the light source device of FIG. 1 observed from the A-direction.

FIG. 3 is a schematic diagram showing a part of the light source device of FIG. 1 observed from the A-direction. FIG. 3 illustrates a part corresponding to the diffraction grating 110 to the adjusting lens 114 of the light source device 100. As shown in FIG. 3, the first beam 105*a*, the second 105*b*, and the third beam 105*c* are diffracted by the diffraction grating 110 and the diffracted beams are incident on the output coupler 112. As shown in FIG. 1, when seen from the y-axis direction, all the diffracted beams are diffracted in a direction of the same angle of diffraction. The diffraction grating 110 has a one-dimensional grating pattern arrayed in parallel to the y-axis direction, which does not affect the upward or downward inclination angles of the first beam 105*a* and the third beam 105*c*. Accordingly, the diffracted first beam 105*a* and third beam 105*c* are incident on the output coupler 112 at the same inclination angle.

A portion of the diffracted beams incident on the output coupler 112 is reflected by the output coupler 112, and a different portion of the diffracted beams incident on the output coupler 112 pass through the output coupler 112 and emitted from the light-emitting surface 112*b*. The adjusting lens 114 is configured to convert the light emitted from the output coupler 112 into substantially parallel light, or to condense the light emitted from the output coupler 112 and to output. If the light-reflecting surface of the output coupler 112 is a flat surface, the second beam 105*b* perpendicularly incident on the flat surface is reflected back along the optical path and enters into external resonance, but the first beam 105*a* and the third beam 105*c* are obliquely incident on the light-reflecting surface and are not reflected back into respective optical paths and thus cannot enter into external resonance. In the present specification, an output coupler having a flat light-reflecting surface may also be referred to as a "flat coupler."

The output coupler 112 of the light source device 100 has a depressed light-reflecting surface 112*a* configured to allow the first beam 105*a* and the second beam 105*b* to have incident angles perpendicular to the light reflecting surface 112a. The depressed light-reflecting surface 112a allows not only the second beam 105b but also the first beam 105a and the third beam 105c to reflect back into respective optical paths and enter external resonance. Accordingly, a number of laser beams entering external resonance can be increased, allowing for an improvement in the quality of the laser beams emitted from the light source device 100, and enhancing the output power of the light source device 100.

The depressed light-reflecting surface 112a can be formed in any appropriate shape that allows an increase in the amount of light reflected back into the optical path (may also referred to as "amount of returning light" in the present specification). For example, the depressed light-reflecting surface 112a may be an inwardly curved surface. The inwardly curved surface may be, for example, a concave spherical surface. For example, the light-reflecting surface 112a of the output coupler 112 shown in FIG. 3 can be formed as an inwardly bulging spherical surface corresponding to a sphere centered on an intersection point of extension lines of the diffracted first beam 105a, second beam 105b, and third beam 105c. With this arrangement, the first beam 105a, the second beam 105b, and the third beam 105c are incident on the light-reflecting surface 112a at a right angle, so that the beams can be reflected back into respective optical paths by the light-reflecting surface 112a. If the amount of the returning light can be increased, a concave aspherical surface can be employed for the inwardly curved light-reflecting surface 112a. In the present specification, an output coupler having a light-reflecting surface that is an inwardly curved surface may also be referred to as a "curved coupler".

Figure 4:
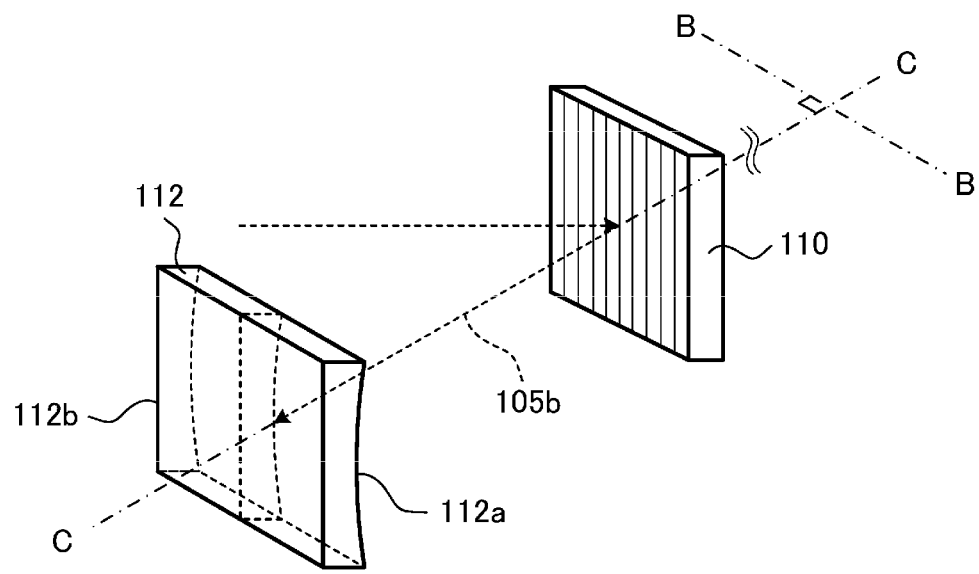
FIG. 4 is a schematic diagram showing an embodiment in which an output coupler having a reflecting surface of a concave cylindrical surface.

FIG. 4 is a schematic diagram showing an embodiment in which an output coupler having a reflecting surface of a concave cylindrical surface. As shown in FIG. 4, the inwardly curved light-reflecting surface 112a may be a concave cylindrical surface. FIG. 4 is a schematic perspective view illustrating a part corresponding to the diffraction grating 110 to the output coupler 112 of the light source device 100. In FIG. 4, the second beam 105b represents a light beam that is incident on the diffraction grating 110 along the optical axis of the light-condensing part 108 and is diffracted. The second beam 105b overlaps with the optical axis CC of the diffracted beam.

The dash-dot line BB in FIG. 4 indicates a center axis of the concave cylindrical light-reflecting surface 112a. The center axis BB of the light-reflecting surface 112a is at a right angle to the optical axis CC of the diffracted light and in a plane defined by the optical axis CC of the diffracted light and the optical axis of the light-condensing part 108. In particular, when the light-condensing part 108 of the light source device 100 includes a cylindrical lens having a center axis parallel to the y-axis (see FIG. 1), the concave cylindrical surface of the light-reflecting surface 112a of the output coupler 112 may be a concave circular cylindrical surface.

The radius R of a basic circle of the cylindrical surface that corresponds to concave circular cylindrical surface can be determined by the equation (1) below.

$$R = f_1 \times 2 + L \quad (1)$$

In the equation (1), $f_1$ is a focal distance of the light-condensing part 108, and L is a distance between the diffraction grating 110 and the output coupler 112.

Figure 5:
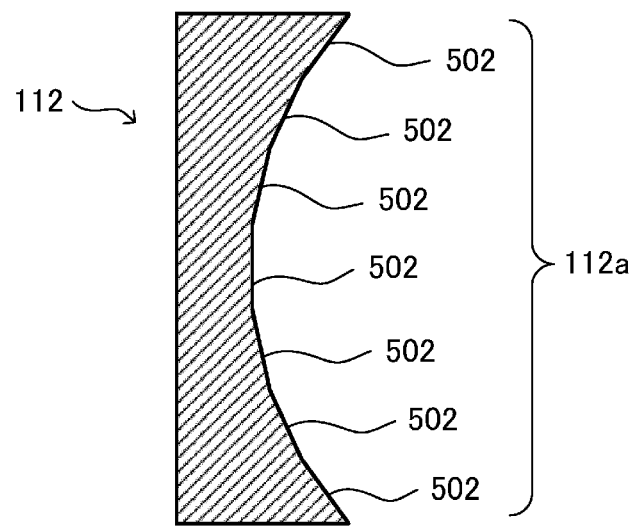
FIG. 5 is a schematic diagram of an output coupler having a light-reflecting surface formed with a plurality of planar segments.

FIG. 5 is a schematic diagram of an output coupler having a light-reflecting surface formed with a plurality of planar segments. As shown in FIG. 5, the depressed surface of the light-reflecting surface 112a of the output coupler 112 may be formed with a plurality of planar segments 502. Each of the planar segments 502 has a small planar dimension and the light-reflecting surface 112a is formed with a combination of the planar segments 502.

As shown in FIG. 3, because the light-reflecting surface 112a is a depressed surface, the output coupler 112 acts as a concave lens when a diffracted light passes through it. Accordingly, light that passed through the output coupler 112 and emitted from the light emission surface 112b further spread by refraction. The adjusting lens 114 is configured to convert the light emitted from the output coupler 112 into substantially parallel light, or to condense the light emitted from the output coupler 112 to reduce spreading of the light.

Figure 6:
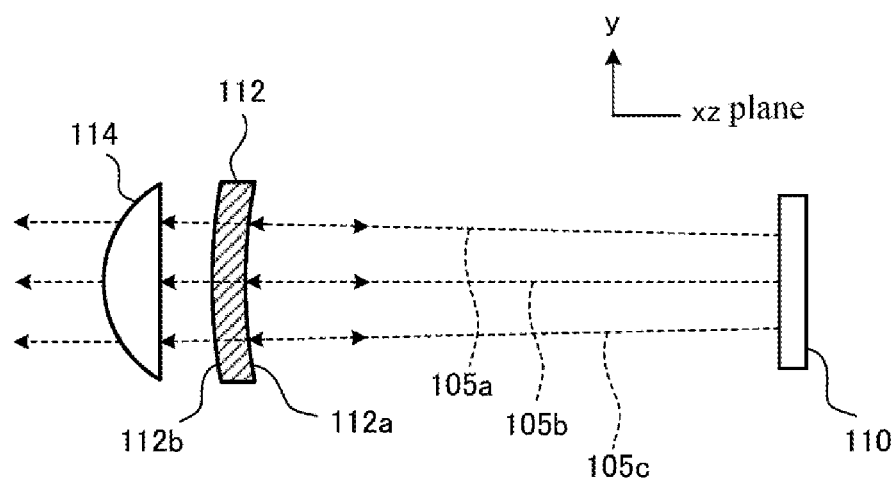
FIG. 6 is a schematic diagram showing a part of a light source device according to another embodiment of the present invention.

FIG. 6 is a schematic diagram showing a part of a light source device according to another embodiment of the present invention, which is a variation of the embodiment as described above. In the present embodiment, members, parts, and parameters having the same functions as in the above-described embodiment are given the same reference numerals as in the above-described embodiment, and description of those members, parts, and parameters may be appropriately omitted. The embodiment below differs from the above-described embodiment in that the output coupler 112 has the light-reflecting surface 112a and the light-emitting surface 112b that are both curved surfaces, and the light-emitting surface 112b is a curved surface that is parallel to the light-reflecting surface 112a.

Herein, the term parallel refers to the shape of the light-emitting surface 112b being in conformity to the shape of the light-reflecting surface 112a such that light incident on the light-reflecting surface 112a at a right angle is emitted from the light-emitting surface 112b at a right angle. The light perpendicularly incident on the light-reflecting surface 112a of such an optical coupler 112 is not further spread by refraction at the light-emitting surface 112b when it passes through the output coupler 112, which allows the use of an adjusting lens 114 having a small size, a large radius of curvature, and small change in curve shape.

Figure 7:
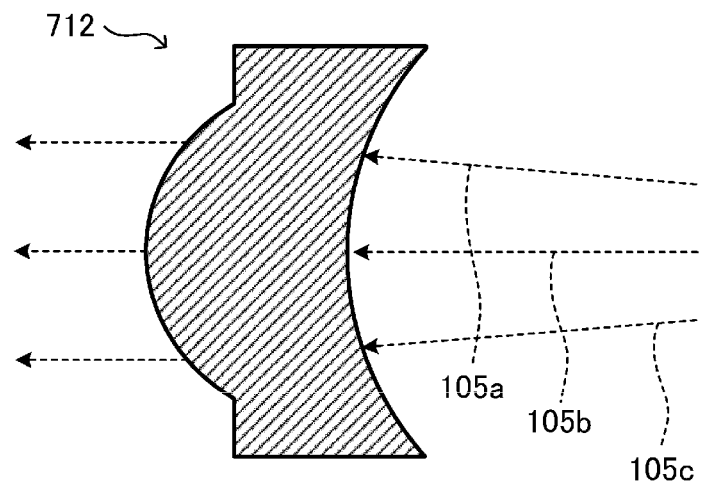
FIG. 7 is a schematic diagram showing an embodiment in which an adjusting lens is integrally formed with an output coupler.

FIG. 7 is a schematic diagram showing an embodiment in which a focusing lens is integrally formed with an output coupler, which is a variation of the embodiment described above. The output coupler 712 of the present embodiment is obtained by integrally forming the adjusting lens 114 and the output coupler 112 described in the above embodiment. With such a structure, the number of components of the light source device can be reduced and workload in assembly and adjustment of the optical system can be reduced.

Figure 8:
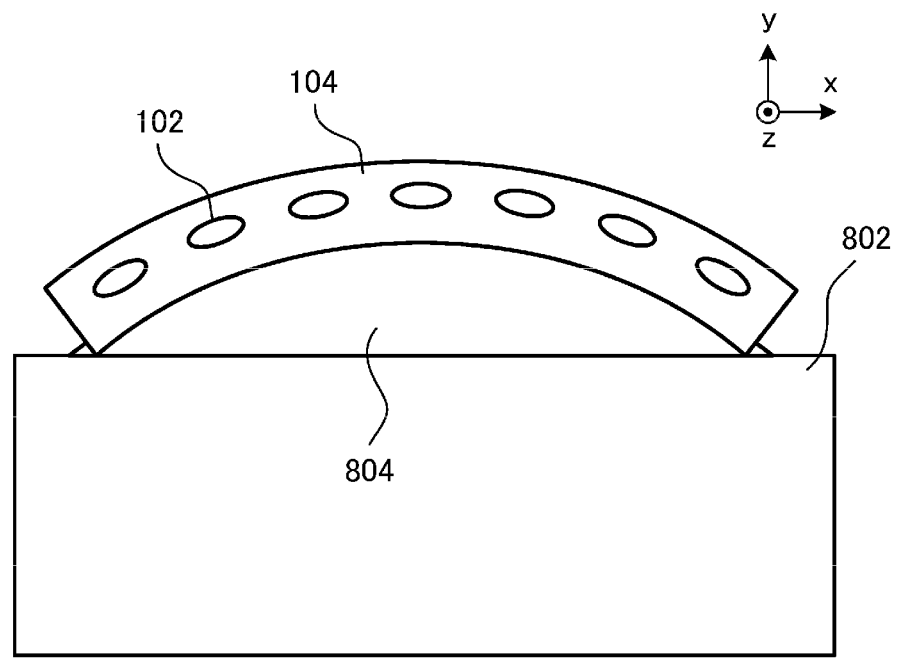
FIG. 8 is a schematic diagram showing a deformed laser diode bar observed from the optical axis direction.

FIG. 8 is a schematic diagram showing a deformed laser diode bar observed from the axis direction. The laser diode bar 104 is generally bonded on a sub-mount 802 by using a bonding material 804 such as a solder. Although it is ideal for all the light emitting portions 102 in the laser diode bar 104 to be aligned at the same height, unevenness in the bonding, thermal deformation due to heating/cooling, and the like may cause deviation in heights of the light-emitting portions 102 by several microns. A typical example thereof is a warpage deformation referred to as "smile," as shown in FIG. 8, in which the array of the light-emitting portions 102 is curved with the center of the laser diode bar 104 located highest and the light-emitting portions 102 at the both ends located lowest. As described above, when the output coupler is a flat coupler, and when individual light-emitting portions are misaligned from the optical axis of the collimator in a height direction, light emitted from the misaligned light-emitting portions is not reflected back into respective optical paths and may not enter the external resonance.

Figure 9:
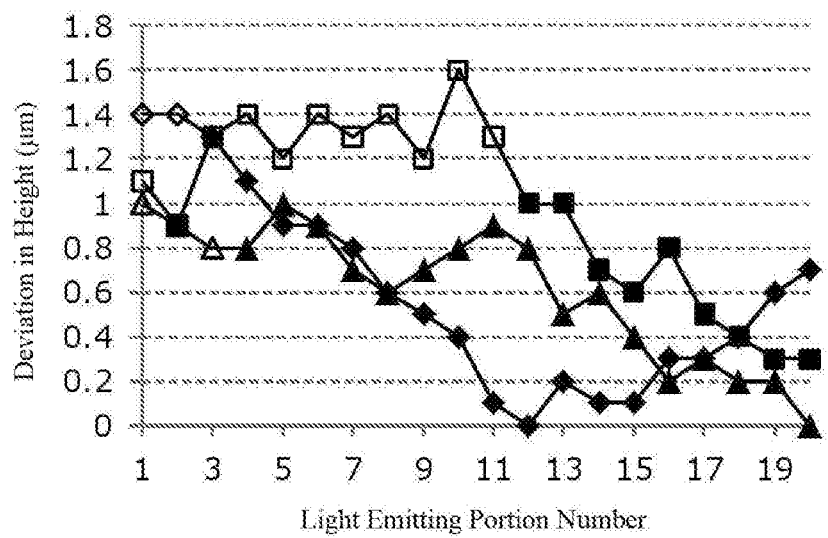
FIG. 9 is a diagram illustrating a result of examining the relationship between deviation in the heights of the laser light sources and external resonance in the light source device having a flat coupler.

FIG. 9 is a diagram illustrating a result of examining the relationship between deviation in the heights of the laser light sources and external resonance in the light source device having a flat coupler. Three laser diode bars were examined. Each of the laser diode bars includes 20 light-emitting portions that were arranged laterally in a row. The horizontal axis is the number of each respective light-emitting portion, given sequentially from one end of the laser diode bar. The vertical axis represents the deviation of the light emitting portions in the height direction with respect to the optical axis of the collimator. The results of three laser diode bars are represented by square, triangle, and diamond symbols, respectively. Filled symbols indicate occurrence of external resonance and open symbols indicate absence of external resonance.

From FIG. 9, a deformation pattern of each laser diode bar can be identified. In the laser diode bar indicated by the square symbol, the heights of the third to eleventh light-emitting portions are higher and the heights of the light-emitting portions at the both ends of the laser diode bar are relatively lower, showing a "smile" type deformation. In the laser diode bar indicated by the triangular symbol, the heights of the light-emitting portions at the left end part are higher and the heights of the light-emitting portions at the right end part are lower. Although there are some ups and downs, the deformation shows overall inclination of high toward the left side and low toward the right side. In the laser diode bar indicated by the diamond symbol, the heights of the eleventh to seventeenth light-emitting portions are lower and the heights of the light-emitting portions at the both ends of the laser diode bar are relatively higher, showing a "smile" type deformation. The three laser diode bars show different deformation patterns, but in all of the laser diode bars, light emitted from a light-emitting portion with a deviation in the height direction approximately 1 µm or greater tends to exhibit absence of external resonance.

As described above, forming the light-reflecting surface 112a of the output coupler 112 as a depressed surface allows for an increase in the amount of returning light that allows light emitted from the light-emitting portion(s) deviated in the height direction with respect to the optical axis of the collimator to enter external resonance. A shape of the depressed surface (a shape of an inwardly curved surface when the depressed surface is a curved surface) and an amount of returning light can be predicted by computer simulations. Next, a computer simulation performed by using an optical simulation software "ZEMAX" by Zemax Ltd. will be described as an example.

Figure 10:
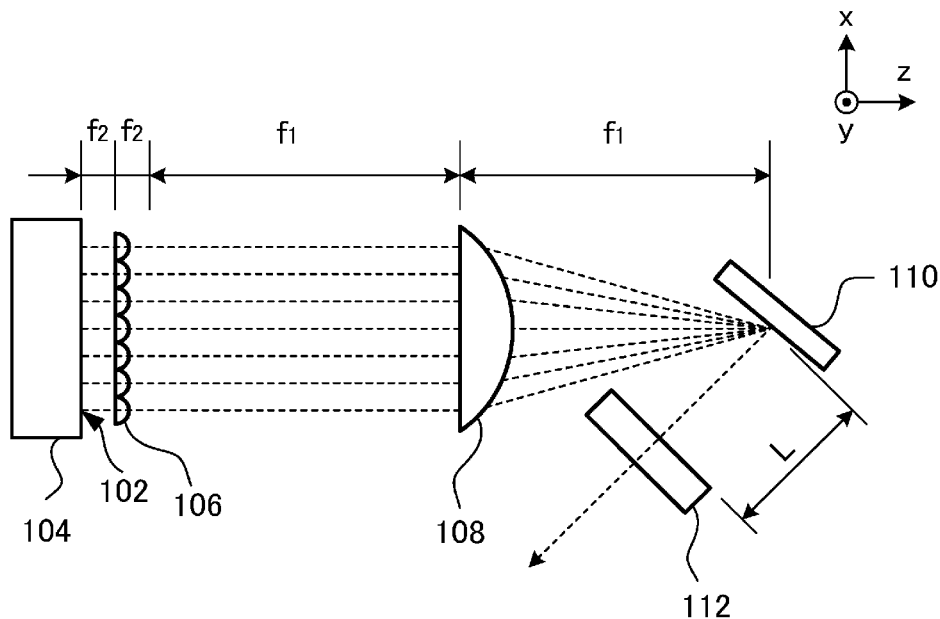
FIG. 10 is a schematic diagram illustrating a light source device model used in computer simulation.

FIG. 10 is a schematic diagram illustrating a basic light source device model used in the computer simulation. In FIG. 10, members, parts, and parameters having the same functions as in the above-described embodiment are given the same reference numerals as in the above-described embodiment. In the model, the collimator 106 includes an array of lenses each having an optical axis at the same height as the optical axis of the light-condensing part 108. The light-condensing part 108 is a cylindrical lens having a center axis parallel to the y-axis. The diffraction grating 110 has a one-dimensional grating structure parallel to the y-axis. The output coupler 112 has a concave cylindrical reflecting surface. The center axis of the cylinder corresponding to the concave cylindrical surface is at a right angle to the optical axis of the diffracted light and in a plane defined by the optical axis of the diffracted light and the optical axis of the light-condensing part 108. For comparison, a simulation was performed under a condition for using a flat coupler as the output coupler 112.

In FIG. 10, $f_1$ indicates a focal distance of the light-condensing part 108, $f_2$ indicates a focal distance of the collimator 106, and L indicates a distance between the diffraction grating 110 and the output coupler 112. The radius R of a basic circle of the cylindrical surface that corresponds to the reflecting surface of the optical coupler 112 can be determined by the equation (1). As shown in FIG. 10, the collimator 106 is arranged at a distance $f_2$ from the light emitting portions 102 of the laser diode bar 104, the light-condensing part 108 is arranged at a distance $(f_2+f_1)$ from the collimator 106, and the diffraction grating 110 is arranged at a distance $f_1$ from the light-condensing part 108. Further, the output coupler 112 is arranged on an optical axis of first-order diffracted light diffracted by the diffraction grating 110 and at a distance L from the diffraction grating 110. When $f_1=150$ mm, $f_2=1$ mm, and $L=57$ mm, then $R=357$ mm.

Figure 11:
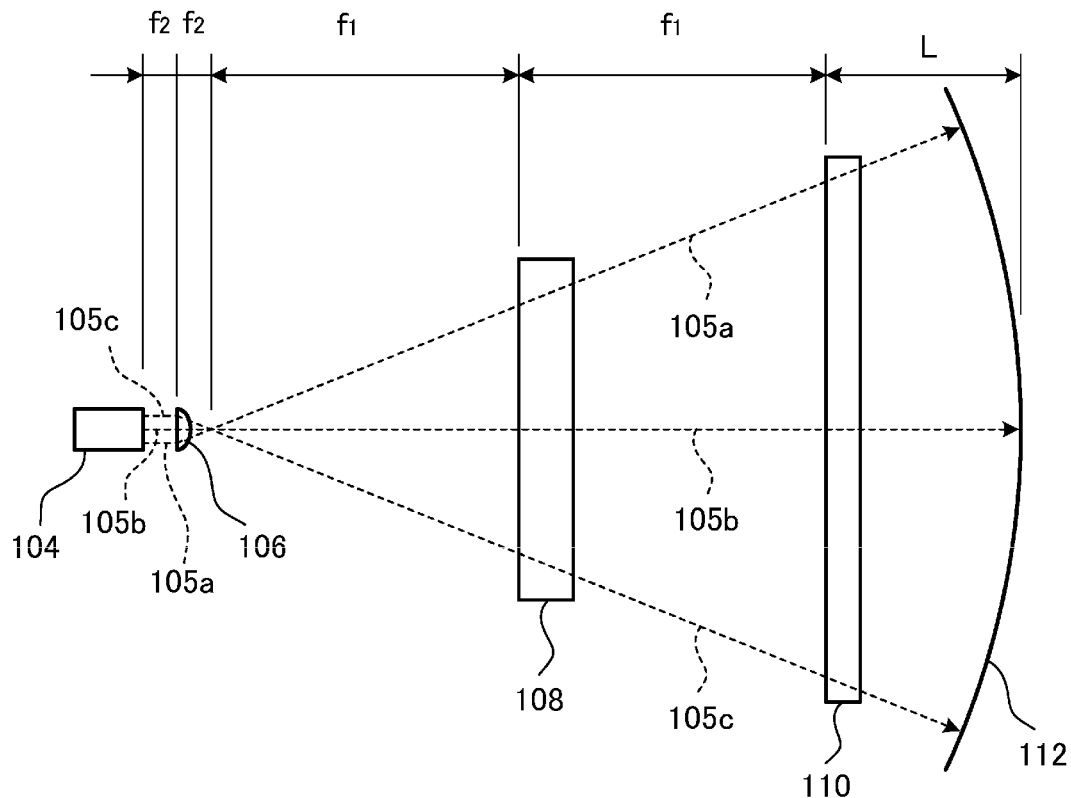
FIG. 11 is a schematic diagram illustrating the optical system in the light source device model shown in FIG. 10.

FIG. 11 is a schematic diagram illustrating the optical system in the light source device model shown in FIG. 10. Although the optical path is diffracted by the diffraction grating 110 as shown in FIG. 10, for easy understanding, all the optical paths are shown in straight lines in FIG. 11. In FIG. 11, an up-down direction is the y-axis direction shown in FIG. 10. The first beam 105a, the second beam 105b, and the third beam 105c respectively shown by broken lines are, as illustrated in FIG. 2, light emitted from the light-emitting portions 102 at different heights.

The light-condensing part 108 is a cylindrical lens having a center axis parallel to the y-axis, so that inclination angles in up/down direction of the light passed through the light-condensing part 108 are not changed. The diffraction grating 110 has a one-dimensional grating structure parallel to the y-axis, which does not affect inclination angles in up/down direction of the diffracted light. Accordingly, the first beam 105a, the second beam 105b, and the third beam 105c are allowed to propagate to the output coupler 112 while maintaining inclination angles obtained when passing through the light-condensing part 106.

Figure 12:
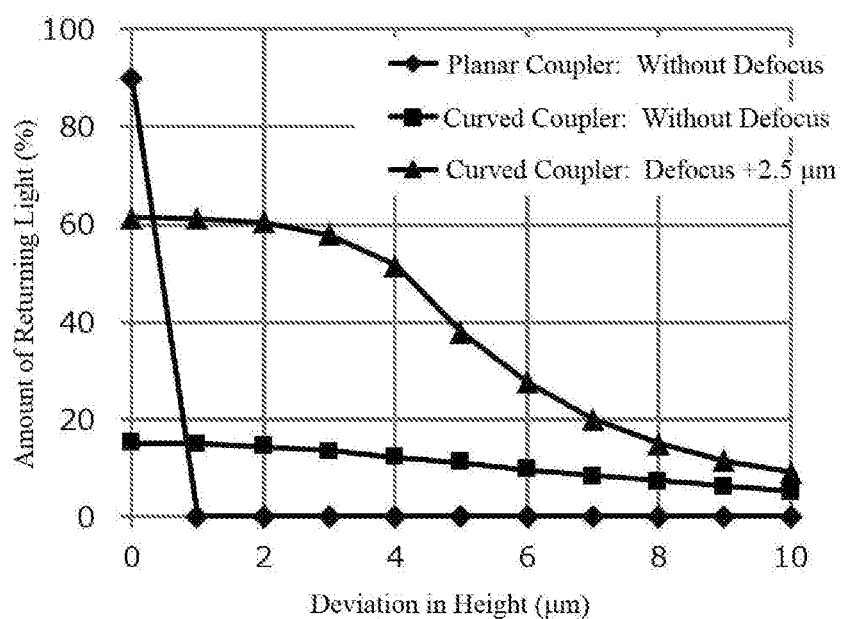
FIG. 12 shows result of computer simulations.

FIG. 12 shows results of computer simulations. The horizontal axis represents deviation in a height direction of the light-emitting portions 102 with respect to the optical axis of the light-condensing part 106. The vertical axis represents amounts of returning light reflected at the light-reflecting surface of the output coupler 112 back into respective optical paths. FIG. 12 shows the simulation results performed under three different conditions respectively indicated by a diamond symbol, a square symbol, and a triangle symbol. The diamond symbol represents a simulation result of a light source device that uses a flat coupler. The square symbol and triangle symbol each represent a simulation result of a light source device with a curved coupler having a light-reflecting surface of a concave cylindrical shape.

The term "defocus" as indicated in FIG. 12 refers to, in the simulation, shifting the location of the lens array of the collimator 106 in the z-axis direction from the location shown in FIG. 10. In contrast, "without defocus" refers to the lens array of the collimator 106 located at the same location shown in FIG. 10. Further, "defocus+2.5" refers to the lens array of the collimator 106 sifted by 2.5 µm in positive z-axis direction (that is, to the right direction in FIG. 10) from the location shown in FIG. 10.

As shown in FIG. 12, when a flat output coupler is used and the light emitting portions do not substantially deviate in the height direction, 90% of the beams are reflected back into respective optical paths by the output coupler 112. However, if a deviation in the height direction is 1 µm or greater, the amount of returning light becomes zero, such that none of the beams will be returned into respective optical paths, such that external resonance will not be created. The results of simulations agree with the results of the experiments shown in FIG. 9.

The light source device using a curved coupler in the case of "without defocus," as shown by square symbol, exhibits an amount of returning light of merely 15% even without a deviation in the height of the light-emitting portions, but the amount of the returning light does not decrease to zero even when the deviation in the height is 10 µm, and about 5% of the amount of returning light can be maintained. Meanwhile, in the case of "defocus+2.5", as shown by triangle symbol, the amount of returning light significantly increases. In absence of deviation in the height of the light-emitting portions, an amount of returning light of 60% or greater can be obtained. Even in the occurrence of a 4 µm deviation in the height, 50% or greater of the amount of returning light can be maintained. Moreover, in the occurrence of a 7 µm deviation in the height, 20% of the amount of returning light can be maintained.

As described above, when a deformation of 1 µm or greater occurs in the height direction of the laser diode bar 104, the use of a curved coupler in place of a flat coupler can increase the number of the laser diodes that externally resonate, and accordingly, the output power and quality of the laser beams emitted from the light source device can be improved.

Figure 13:
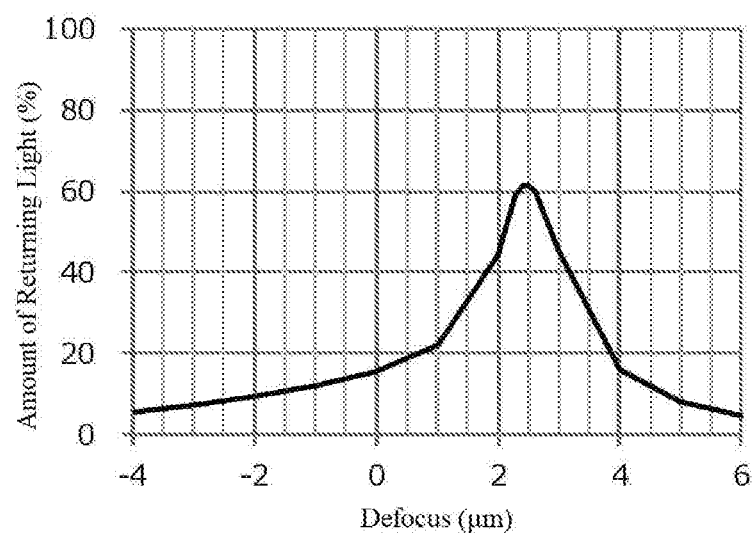
FIG. 13 shows a result of computer simulation of a light source device having a curved coupler.

FIG. 13 shows a result of a computer simulation of a light source device having a curved coupler. FIG. 13 shows the influence of defocusing to the amount of returning light at the deviation in the height direction of zero. From the result shown in FIG. 13, the peak in the amount of returning light is found to be at a defocus of +2.5 µm. In the range between 0 to 4 µm of defocusing, an amount of returning light equal to or greater than that at defocusing zero can be obtained. The computer simulation was repeated with varying the values of $f_1$, $f_2$, and L. All the results indicated the presence of the peak in the amount of returning light at a positive (i.e., "+") defocusing, in other words, when defocusing in a positive direction.

Each of the light-emitting portions 102 is not a perfect point light source and has a predetermined size. Accordingly, beams emitted from the light-emitting portions 102 and pass through the collimator 106 and the light-condensing part 108 will not be perfectly collimated, resulting in slightly diverging beams. The beams are condensed when the collimator 106 is defocused in the positive direction of the z-axis, but the condensing is offset by the divergence due to the predetermined size of the light sources, creating a peak in the amount of returning light at some point (value) on the z-axis. An increase in the defocusing amount greater than the value that gives the peak in the amount of the returning light, condensing of beams exceeds and the amount of returning light decreases.

Although the first beam 105a and the third beam 105c passing through the light-condensing part 108 are each shown by a single straight line in FIG. 11 for easy understanding, at the time of entering the light-condensing part 108, each of the beams 105a and 105c is refracted toward the optical axis of the condenser 108 (the direction of the second beam 105b) and at the time of leaving the lens, the first beam 105a and the third beam 105c are refracted and propagate at an angle equal to the incident angle to the light-condensing part 108. Accordingly, extensions of the straight lines corresponding to the first beam 105a and the third beam 105c that are after passing the light-condensing part 108 intersect on the z-axis at a point further shifting in the positive direction than the rear focal point of the collimators 106.

As described above, when a curved coupler is used, the peak in the amount of returning light is obtained at a location where the collimators 106 are defocused in the positive direction along the z-axis.

Accordingly, in order to obtain greater amount of returning light, the distance between the collimators 106 and the laser diode bar 104 (light-emitting unit 102) is preferably equal to or greater than the focal distance $f_2$ of the collimators 106. For example, the distance between the collimators 106 and the laser diode bar 104 (light-emitting unit 102) is preferably equal to or greater than the focal distance $f_2$ of the collimators 106 and equal to or less than (f2+4 µm).

The embodiments described above are provided for easy understanding of the present invention, but the present invention is not limited thereto. Some of the configurations in the described embodiments may be replaced by other configurations, or may be eliminated.

For example, in the embodiment described above, a laser diode bar having a plurality of laser light sources arranged laterally in a row is illustrated as a light source part, but the light source part is not limited thereto. A laser diode stack having a plurality of laser light sources arranged in a matrix may also be employed as the light source part. Alternatively, a plurality of laser diodes of a can-type or a SMD-type may be employed. In the embodiments described above, a reflection type diffraction grating is illustrated in the figures as an example of diffraction grating, but a transmission type diffraction grating may also be employed.

It is to be understood that various other embodiments and variants within the scope and spirit of the invention may occur to those skilled in the art, and such other embodiments and variants are intended to be covered by the following claims.

What is claimed is:

1. A light source device comprising:
    a light source part comprising a plurality of laser light sources, each laser light source being configured to emit light having a predetermined wavelength width;
    a plurality of collimators, each configured to convert light emitted from a corresponding one of the laser light sources into substantially parallel light;
    a light-condensing part configured to adjust light emitted from the collimators into parallel light and to condense the parallel light;
    a diffraction grating configured to receive the condensed light;
    an output coupler disposed in an optical path of diffracted light from the diffraction grating so as to form an external resonator with the laser light sources, wherein a reflecting surface of the output coupler is a concave cylindrical surface having a center axis that is perpendicular to an optical axis of the diffracted light and that is in a plane defined by an optical axis of the diffracted light and an optical axis of the light-condensing part; and
    an adjusting lens disposed downstream of the output coupler, the adjusting lens being configured to convert light emitted from the output coupler into substantially parallel light or to condense light emitted from the output coupler.

2. The light source device according to claim 1, wherein the adjusting lens is integrally formed with the output coupler.

3. The light source device according to claim 1, wherein a light emitting surface of the output coupler is a curved surface that is parallel to the reflecting surface.

4. The light source device according to claim 1, wherein the plurality of laser light sources are laser diodes, and the light source part is a laser diode bar in which the plurality of laser diodes are arranged laterally in one row.

5. The light source device according to claim 1, wherein: the plurality of laser light sources are laser diodes, the light source part, is a laser diode bar in which the plurality, of laser diodes are arranged laterally in one row, the light-condensing part comprises a cylindrical lens, and the concave cylindrical surface of the output coupler is a concave circular cylindrical surface of radius R determined by an equation $R=fi \times 2 + L$, where fi is a focal distance of the light-condensing part, and L is a distance between the diffraction grating and the output coupler.

6. The light source device according to claim 5, wherein a distance between the collimators and the laser diode bar is equal to or greater than a focal distance $f_2$ of the collimators.

7. The light source device according to claim 6, wherein the distance between the collimators and the laser diode bar is equal to or greater than the focal distance $f_2$ of the collimators and equal to or less than $(f_2+4 \ \mu m)$.

* * * * *

UNITED STATES PATENT AND TRADEMARK OFFICE
CERTIFICATE OF CORRECTION

PATENT NO. : 11,048,096 B2
APPLICATION NO. : 16/203448
DATED : June 29, 2021
INVENTOR(S) : Dejima et al.

Page 1 of 1

It is certified that error appears in the above-identified patent and that said Letters Patent is hereby corrected as shown below:

In the Claims

Claim 5, Column 13, Lines 8-17:
Please delete:
"5. The light source device according to claim 1, wherein: the plurality of laser light sources are laser diodes, the light source part, is a laser diode bar in which the plurality, of laser diodes are arranged laterally in one row, the light-condensing part comprises a cylindrical lens, and the concave cylindrical surface of the output coupler is a concave circular cylindrical surface of radius R determined by an equation R=fi×2+L, where fi is a focal distance of the light-condensing part, and L is a distance between the diffraction grating and the output coupler."

Please replace with:
"5. The light source device according to claim 1, wherein:
    the plurality of laser light sources are laser diodes,
    the light source part is a laser diode bar in which the plurality of laser diodes are arranged laterally in one row,
    the light-condensing part comprises a cylindrical lens, and
    the concave cylindrical surface of the output coupler is a concave circular cylindrical surface of radius R determined by an equation $R = f_1 \times 2 + L$, where $f_1$ is a focal distance of the light-condensing part, and L is a distance between the diffraction grating and the output coupler."

Signed and Sealed this
Twenty-first Day of December, 2021

Drew Hirshfeld
*Performing the Functions and Duties of the
Under Secretary of Commerce for Intellectual Property and
Director of the United States Patent and Trademark Office*